United States Patent [19]
Muraoka

[11] Patent Number: 6,067,727
[45] Date of Patent: May 30, 2000

[54] APPARATUS AND METHOD FOR DRYING SUBSTRATES

[75] Inventor: Yusuke Muraoka, Shiga-ken, Japan

[73] Assignee: Dainippon Screen Mfg. Co., Ltd., Japan

[21] Appl. No.: 08/965,249

[22] Filed: Nov. 6, 1997

[30] Foreign Application Priority Data

Nov. 7, 1996 [JP] Japan .................................. 8-312944

[51] Int. Cl.[7] .................................................. F26B 5/08
[52] U.S. Cl. .............................. 34/317; 34/325; 34/470; 34/58; 34/76
[58] Field of Search .............................. 34/317, 325, 470, 34/58, 76, 77, 78; 134/19, 21, 902; 118/715, 725, 730

[56] References Cited

U.S. PATENT DOCUMENTS

| | | | |
|---|---|---|---|
| 5,351,415 | 10/1994 | Brooks et al. | 34/389 |
| 5,369,891 | 12/1994 | Kamikawa | 34/78 |
| 5,591,264 | 1/1997 | Sugimoto et al. | 118/320 |
| 5,678,116 | 10/1997 | Sugimoto et al. | 396/611 |
| 5,715,612 | 2/1998 | Schwenkler | 34/470 |

FOREIGN PATENT DOCUMENTS 62-142328 6/1987 Japan .
1255227 12/1989 Japan .

*Primary Examiner*—Henry Bennett
*Assistant Examiner*—Steve Gravini
*Attorney, Agent, or Firm*—Ostrolenk, Faber, Gerb & Soffen, LLP

[57] ABSTRACT

A cover is provided to an opening of a chamber in such a manner to open and close the opening and when the cover closes the opening, the chamber and the cover form a sealed drying process space. In this drying process space, nitrogen gas is supplied to purge the gas in the drying process space to turn into an inert gas filled space. Thereafter, substrates to be treated are brought into the drying process space. nitrogen gas is further supplied to the drying process space and then the substrates are being rotated to dry the same.

12 Claims, 9 Drawing Sheets

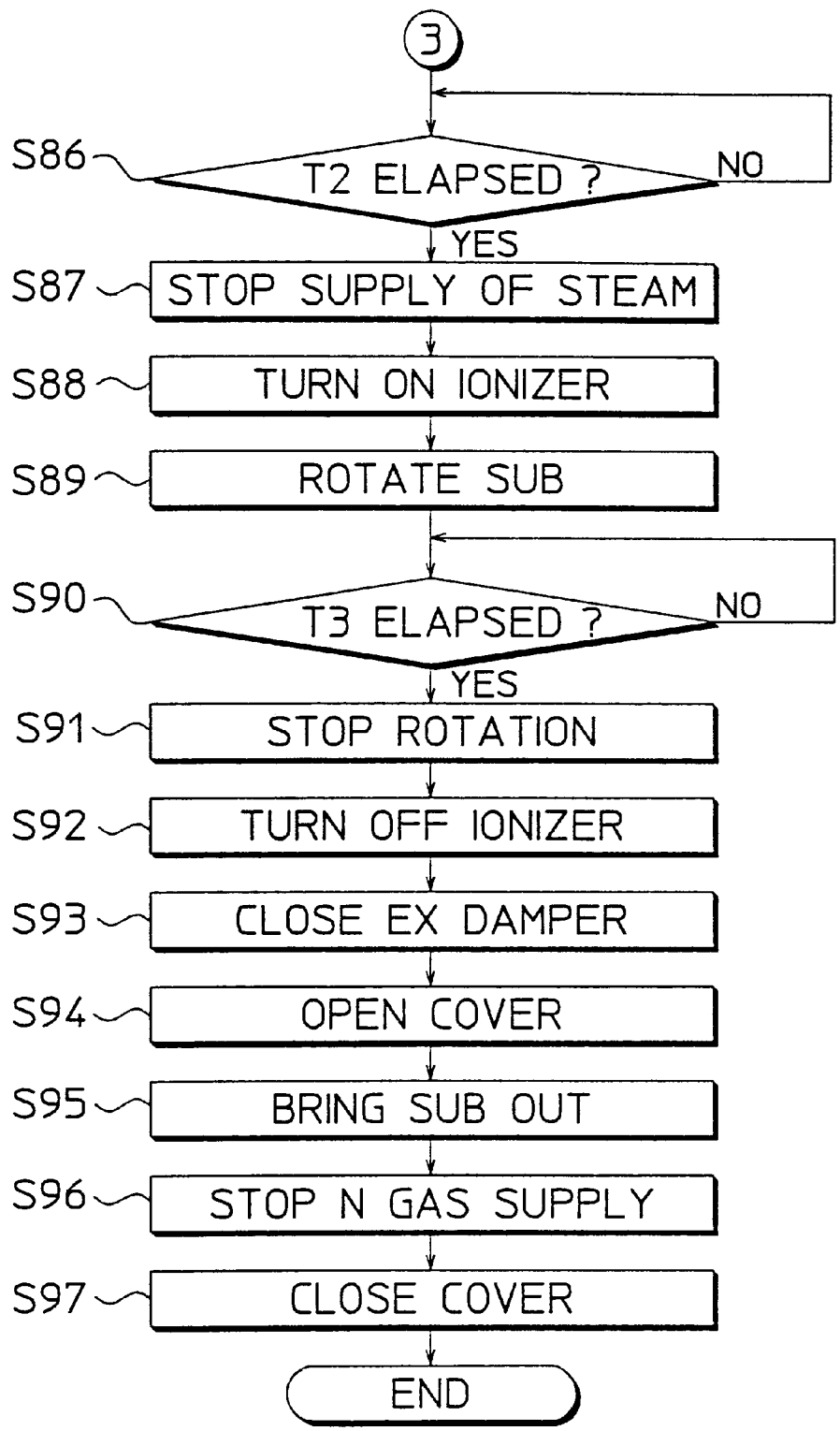

APPARATUS AND METHOD FOR DRYING SUBSTRATES

BACKGROUND OF THE INVENTION

1. Field of the Invention

The present invention relates to an apparatus and method for drying a substrate such as a semiconductor wafer, a glass substrate for a liquid crystal display panel, a mask substrate for a semiconductor producing device or the like, by removing liquid droplets on the substrate.

2. Description of the Background Art

One of the well known types of substrate drying apparatuses requires rotation of the substrate to remove wiping out droplets adhering to the surface of the substrate. Such an apparatus includes a chamber with an opening through which plural substrates enter and exit the chamber, a cover for closing the opening to prevent droplets of the substrates from being splashed out through the opening when substrates are subject to a drying operation by rotation, a filter provided on the cover for introducing ambient air inside the chamber, rotation means for holding the substrates in the chamber and for rotating the substrates, and an exhaust section for exhausting the ambient air sucked through the filter out of the chamber. In this rotation type substrate drying apparatus, the principal of drying the substrate lies in a use of centrifugal force generated by rotation means to blow away droplets in a radial direction of the substrate and a use of a flow of air sucked in through the filter by the rotation of the rotation means, i.e., the sucked in air flows over the surface of the substrate to enhance drying operation.

In another conventional type substrate drying apparatus (as described in Japanese Unexamined Patent Publication No 62-142328), it is proposed, for enhancement of the drying process, that ethanol be supplied over the surface of the substrate to replace the liquid droplets adhering over the substrate surface with supplied ethanol droplets and then the substrate is subject to drying by rotation of the substrate.

These conventional substrate drying apparatuses described in the above have one thing in common, that is, to intake the ambient air into the chamber the surface of the substrate being rotated in the chamber is exposed to oxygen contained in the sucked in ambient air. When the substrate being dried with exposure of oxygen an oxidation is subject to occur at the boundary between the substrate surface and the liquid droplets. The same kind of oxidation is subject to occur at the three dimensional structure of the device such as trenches. The oxidation if it occurs at the boundary, it will cause a problem in a film formation process in a later stage, resulting in poor production efficiency of the substrate manufacturing line comprising the above mentioned apparatus.

SUMMARY OF THE INVENTION

In view of the above, an object of the present invention is to solve the problems of the conventional apparatuses described in the above section.

It is another object of this invention to provide a rotation type substrate drying apparatus and a method for drying a substrate to prevent oxidation on the surface of the substrate in drying process.

In order to fulfill the above object according to this invention, a substrate drying apparatus in which a substrate is dried by removing droplets adhering to the substrate, especially the droplets at three dimensional structure of device such as trenches, the substrate drying apparatus comprises: a chamber with an opening through which the substrate is taken in and out; a cover for sealing the opening; an inert gas supply means for supplying an inert gas into a sealed drying process space formed by the chamber and the cover; and an exhaust portion for exhausting the supplied inert gas out of the sealed drying process space.

Another form of substrate drying of this invention comprises: a chamber with an opening through which the substrate is brought in and out; a cover changeable between an open state and a close state with respect to the opening for opening and closing the opening respectively and the cover forming a drying process space in association with the chamber when in the close state; inert gas supply means for supplying an inert gas into the drying process space formed by the chamber and the cover to fill in the drying process space with the inert gas.

In addition, this invention is directed to a method for drying a substrate in a drying process space that is formed with a chamber, having an opening and an exhaust section, and a cover for opening and closing the opening by removing liquid droplets adhering to the substrate. The method comprises the steps in the order of: (a) a step of purging for purging gas in a sealed drying process space formed with the chamber and the cover through the exhaust section by supplying an inert gas; (b) a step of forming gas curtain for closing the opening of the chamber by an inert gas; (c) a step of taking in the substrate by opening the cover and thereafter taking the substrate into the chamber through the opening; (d) a step of closing the opening with the cover; and (e) a step of drying the substrate.

These and other objects, features and advantages of the present invention will become more apparent upon reading of the following detailed description and accompanying drawings.

BRIEF DESCRIPTION OF THE DRAWINGS

FIG. 9 is a flowchart showing a drying process of the substrate according to the third embodiment.

DETAILED DESCRIPTION OF TEE PREFERRED EMBODIMENTS OF THE INVENTION

Figure 1:
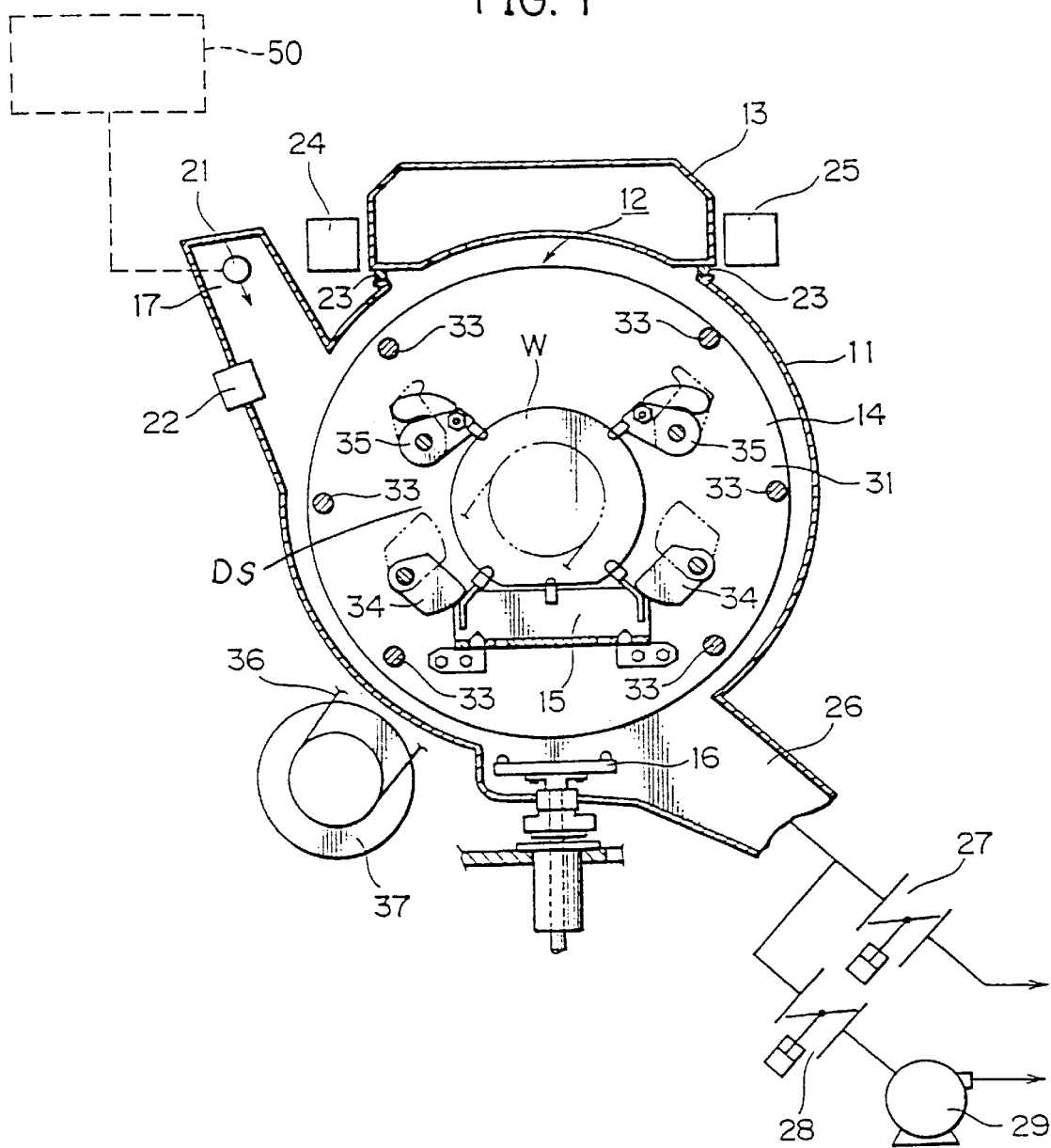
FIG. 1 is a cross sectional side view of a rotational substrate drying apparatus of a first embodiment of the present invention.
Figure 2:
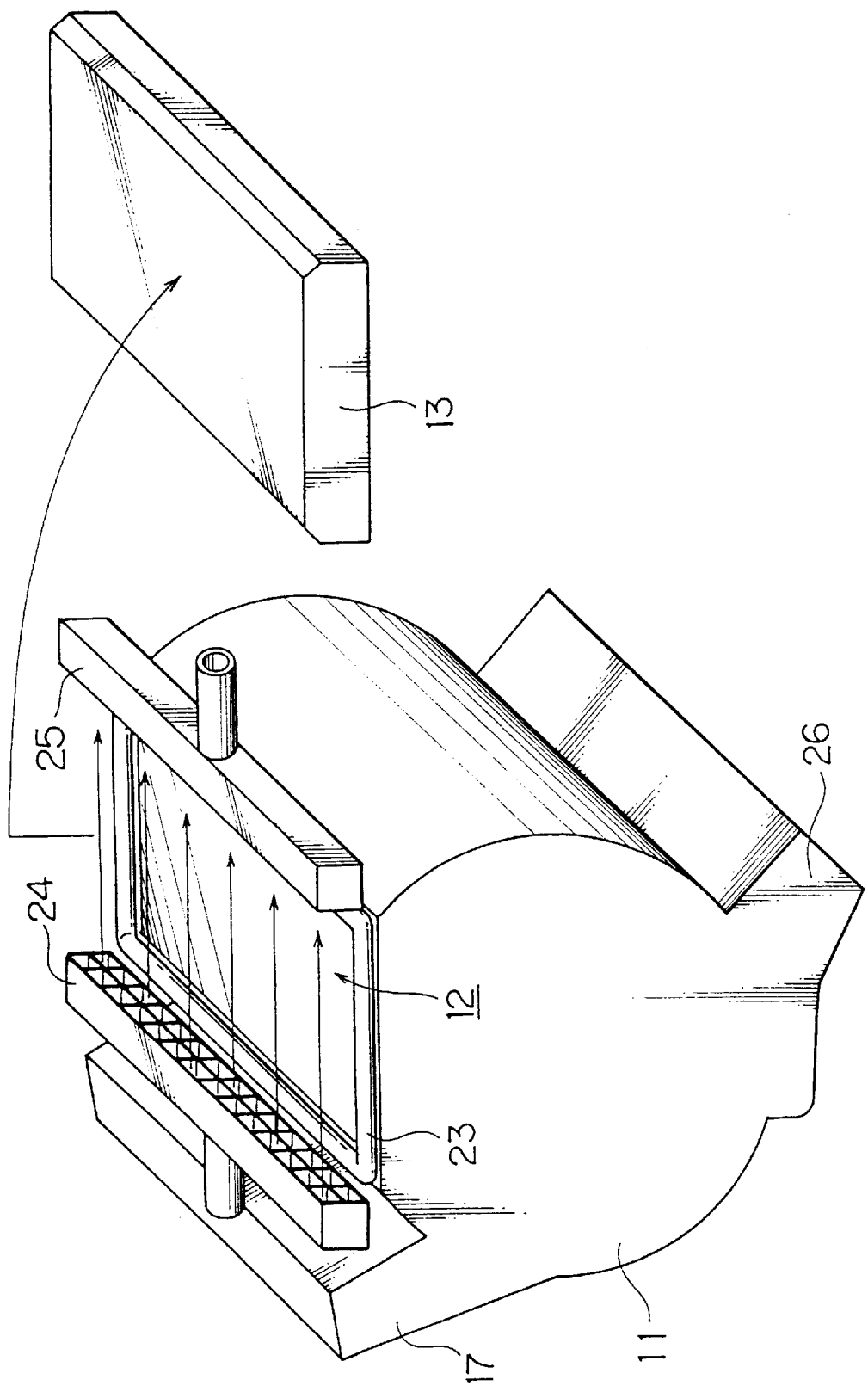
FIG. 2 is a perspective view of the rotational substrate drying apparatus of the first embodiment of the present invention.

An embodiment of the invention is described along with accompanied drawings. FIG. 1 is a cross sectional side view of a substrate drying apparatus in a first embodiment of the present invention. FIG. 2 is a perspective view of FIG. 1.

The substrate drying apparatus is to perform a drying operation of a substantially circular shaped substrate W by rotating the substrate W. The substrate drying apparatus for this purpose includes a chamber 11 of a substantially cylindrical form, a cover 13 for opening and closing an opening formed on the top portion of the chamber 11, a rotor 14 with a horizontally extended shaft disposed in the chamber 11, a substrate support 15 detachably mounted on the rotor 14, and a support lifting mechanism 16 disposed in a lower portion of the chamber 11 to move up and down the substrate support 15.

In the apparatus, the substrate support 15 and the rotor 14 together form rotation means for rotating the substrate.

A reserve space 17 is provided in an obliquely offset portion of the chamber 11 in such a manner to be in communication with the chamber 11. In this space 17, there are provided a nitrogen gas supply nozzle 21 and an ionizer 22. This nitrogen gas supply nozzle 21 supplies nitrogen gas as one of the inert gases into the chamber 11 and is connected to an unillustrated supply source for nitrogen gas. The ionizer 22 electrically discharges a pair of electric-discharging needles by applying high voltage therebetween to ionize gas passing thereby, and is used for the purpose of eliminating static electricity caused by friction between the substrate and nitrogen gas in the drying process. This mechanism is to be described in more detail subsequently.

The reason for the arrangement of the nitrogen supply nozzle 21 and the ionizer 22 both in the reserve space 17 is to avoid the problems that would have resulted from an arrangement of the nitrogen supply nozzle 21 and the ionizer 22 being in the chamber 11 around the outer periphery of the rotor 14. The problem likely occurring with such an arrangement is an increase in returning droplets over the substrate surface by their bouncing back from the nitrogen supply nozzle 21 or the ionizer 22 after the droplets were removed from the substrate. The nitrogen supply nozzle 21 and the ionizer 22 if placed in the chamber 11 function as undesirable projected objects. Another possible problem with such arrangement is an accumulation of the liquid droplets around the area of the nitrogen supply nozzle 21 and the ionizer 22, causing a collection of contaminated substances in the area. To avoid these possible problems, the placement of the nitrogen supply nozzle 21 and the ionizer 22 are preferably in the reserve space 17 that is in communication with the chamber 11 rather than being placed directly in the chamber 11.

In the upper portion of the chamber 11, there is formed a rectangle opening 12 and a packing 23 is placed around a periphery of the opening 12. A cover 13 is placed over the opening 12 to open and close the opening 12. Thus when the cover 13 is placed over the opening 12 as in FIG. 1, the opening 12 is sealed with the cover 13 and the packing 23 thereby to form a drying process space DS in a sealed state.

On the left and right sides of the chamber at its opening area as shown in FIG. 1, a nitrogen gas spray nozzle 24 and a nitrogen gas suction nozzle 25 are provided. The nitrogen gas spray nozzle 24, as shown in FIG. 2, includes lattice form nozzle portions to spray nitrogen gas along the opening 12 as in a form of a nitrogen layer right above the principal plane of the opening 12. The nitrogen suction nozzle 25, on the other hand, has a suction portion that is opposingly arranged to the nitrogen spray nozzle 24 to receive the nitrogen gas sprayed from the nitrogen gas spray nozzle. Accordingly, what is formed right above the opening 12 and between the nitrogen spray nozzle 24 spraying nitrogen gas and the nitrogen suction nozzle 25, suctioning the nitrogen gas sprayed from the nozzle 24, is a nitrogen gas flow functioning as a nitrogen curtain.

In addition, the cover 13 is connected to an unillustrated open/close mechanism thus the cover is capable of being raised in a position and being transferred to a specified position where no interference with the nitrogen suction nozzle 25 occurs, as shown in FIG. 2.

In a portion positioned obliquely below the chamber 11, there is provided an exhaust section 26 to exhaust nitrogen gas supplied to the drying process space DS therefrom. The exhaust section 26 is connected to an unillustrated exhaust duct usually equipped in a clean room via an exhaust damper 27. In addition, the exhaust section 26 is connected to a vacuum pump 29 via a vacuum exhaust damper 28. It should be noted that the exhaust damper 27 and the vacuum exhaust damper 28, described above, are of the type that can securely seal the passage of gas when they are closed.

The rotor 14 is in a structure having a pair of left and right flanges 31 spaced apart from each other (only one side is shown in FIG. 1) and a plurality of connecting rods 33 for connecting the flange pair 31, 31. Specifically the rotor 14 is provided with a support clamp mechanism 34 for fixing a substrate support 15 that supports a plurality of substrates W to the rotor 14 and a substrate clamp mechanism 35 for fixing the substrates W to the substrate support 15. The rotor 14 is connected to a motor 37 via a belt 36 and is rotatable at high speed around an axis perpendicularly coming out from a plane of FIG. 1 upon receiving a driving torque from the motor 37.

In the lower portion of the substrate support 15, a support lift mechanism 16 is provided to move up and down the substrate support 15. The support lift mechanism 16 is set to raise and lower its position upon receiving a driving power from an unillustrated linear sliding electric motor for moving in a vertical direction between a hand out position (unillustrated) where the plural substrates supported on the substrate support 15 are handed to an unillustrated chuck and a position illustrated in FIG. 1.

Figure 3:
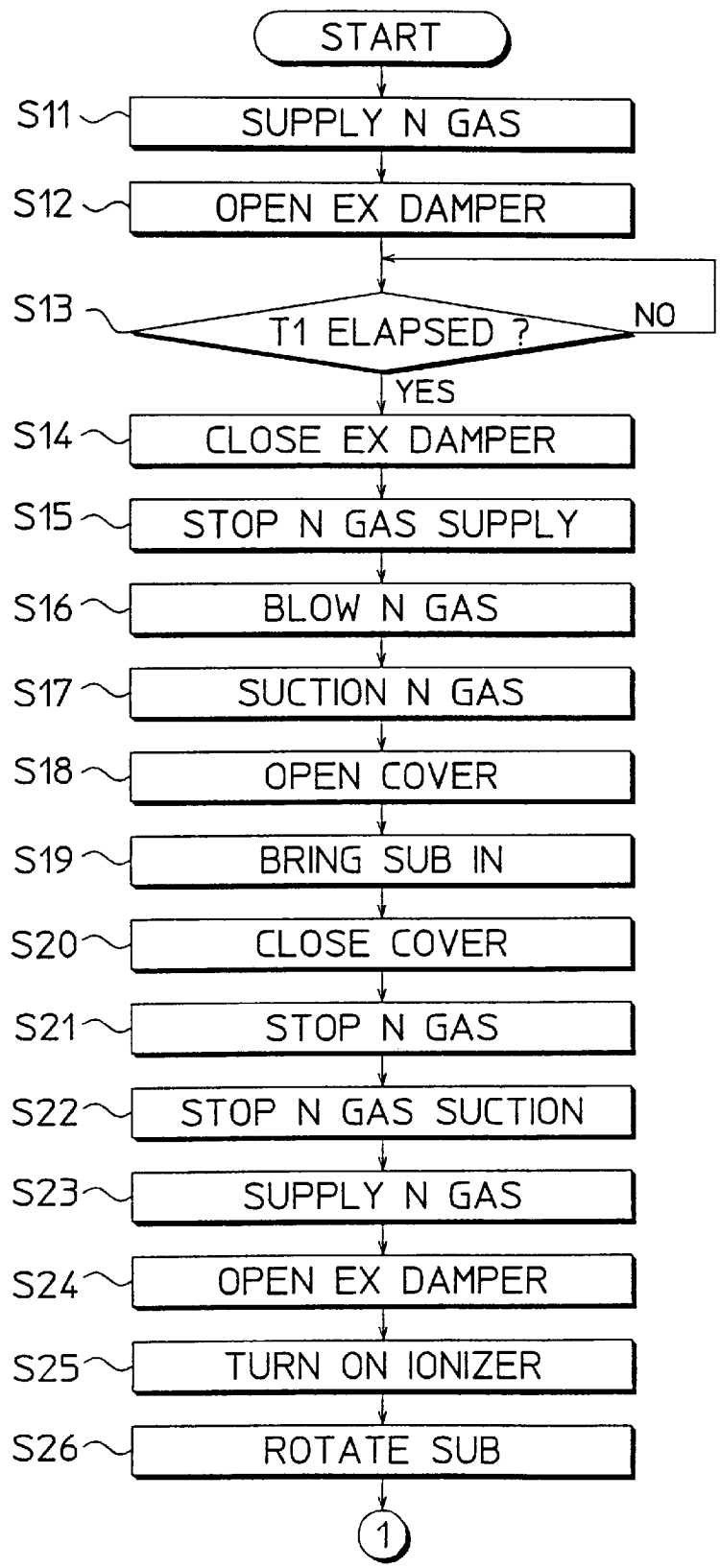
FIG. 3 is a flowchart showing a drying process of the substrate.
Figure 4:
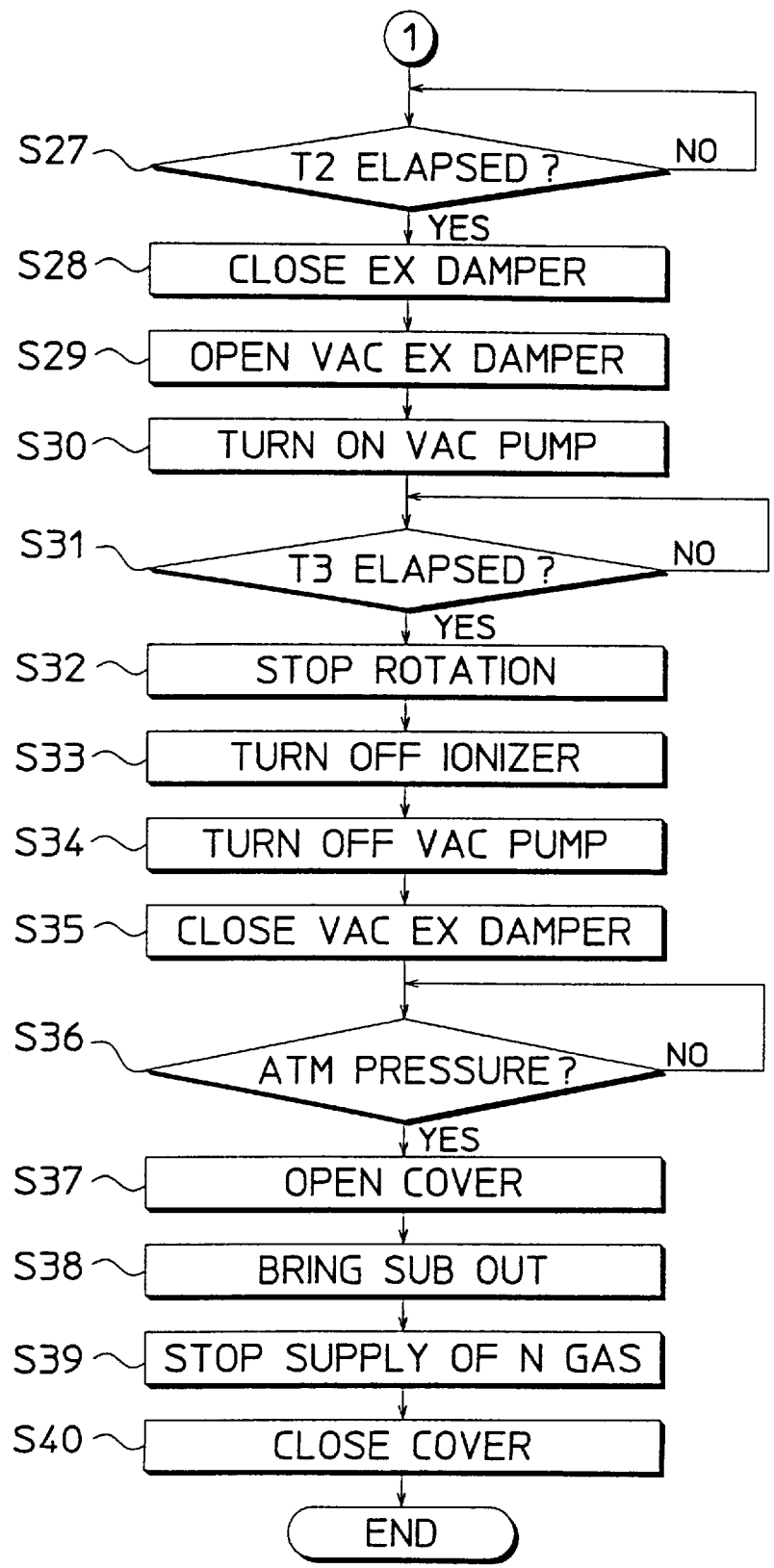
FIG. 4 is a flowchart showing a drying process of the substrate.

A drying operation of the substrates W with the rotational type substrate drying apparatus of this invention is hereinafter described along with flowcharts shown in FIGS. 3 and 4.

At an initial state, it is assumed that the cover 13 and the exhaust damper 27 are set in a closed state. In this state, nitrogen gas is supplied from the nitrogen supply nozzle 21 into the drying process space defined by the chamber 11 and the cover 13 (hereinafter simply referred to as "drying process space DS") (at step 11), then the exhaust damper 27 is set in open state (step 12). This state is maintained until a predetermined time T1 is elapsed (step 13). As a result, contents of gas filling the drying process space DS is purged with the nitrogen gas and the drying process space DS becomes filled with an inert gas.

Then the exhaust damper 27 is closed (step 14) and the supply of the nitrogen gas from the nitrogen gas supply nozzle 21 is halted (step 15). Thereafter, the nitrogen gas spray nozzle 24 is set to spray nitrogen gas (step 16) and the nitrogen gas suction nozzle 25 is set to take in the nitrogen gas being sprayed (step 17).

At this stage, the cover 13 is opened (step 18). At this time, the exhaust section 26 at the chamber 11 is closed and a flow of nitrogen gas (in a form of nitrogen curtain) is formed right above the opening 12 because both the nitrogen gas spray nozzle 24 and nitrogen gas suction nozzle 25 are activated. Because of the flow of nitrogen gas in a form of nitrogen curtain, invasion of the ambient air including oxygen through the opening 12 can be prevented thereby maintaining the drying process space DS being filled with the inert gas.

Then the substrate support 15 is raised in its position to receive the substrates to be treated in chamber 11, and the substrates are brought into the chamber 11 (step 19). At this stage, the substrates brought into chamber 11 pass the curtain flow of nitrogen gas produced by the nitrogen spray nozzle 24 and the nitrogen suction nozzle 25. Thus the ambient air somehow existing around the substrates (particularly spaces formed among the substrates) is blown away by nitrogen gas splashed from the nitrogen gas spray nozzle 24 when the substrates pass through the curtain flow of nitrogen gas formed right above the opening 12. As a result, air is prevented from being brought into the drying process space DS and the drying process space remain filled with the inert gas.

Upon completion of bringing the substrates into the chamber 11, the cover 13 is closed (step 20), then a spray of nitrogen gas at the nitrogen gas spray nozzle 24 is halted (step 21) and at the same time the suction of the nitrogen gas suction nozzle is ceased (step 22).

Then once again nitrogen gas is supplied to the drying process space DS from the nitrogen gas supply nozzle 21 (step 23) and at the same time the exhaust damper 27 is opened to discharge nitrogen gas through the exhaust section 26 to allow formation of a flow of nitrogen gas in the chamber 11 (step 24). In addition, the ionizer 22 is set in an active state to ionize nitrogen gas passing an area of the ionizer 22 (step 25).

At this stage, the rotor 14 is rotated around a rotation center thereof to rotate the substrates W around a vicinity of the center of the principal surface of the substrates W (step 26). Therefore the liquid droplets adhering to the substrates are removed from the surfaces of the substrates by a centrifugal force generated by the rotation thereof, and the drying operation is further enhanced by nitrogen gas supplied from the nitrogen gas supply nozzle 21. The liquid droplets removed from the substrates W are carried along the flow of nitrogen gas in the chamber 11 to the exhaust section 26.

In the above described drying operation, if the substrates are exposed to oxygen, the oxidation is subject to take place in a boundary between a silicon of the substrate and a liquid droplet, thereby forming a water mark on the surface of the substrate, that in turn will cause a problem in a film formation in a later stage. In the above described embodiment, the drying process space defined by the chamber 11 and the cover 13 is purged with nitrogen gas throughout the drying operation, the oxidation on the surface of the substrate is prevented and thus the formation of the water mark is prevented.

Unlike conventional type substrate drying apparatus, the substrate drying apparatus of the present invention does not introduce an ambient air into the drying process space DS, thus a gas (an inert gas) with a certain temperature and a certain humidity can be introduced into the drying process space DS to maintain the space at a desirable condition for drying the substrate. More specifically, as shown in FIG. 1, a temperature/humidity conditioning unit 50 can be installed to adjust the temperature and humidity of nitrogen gas. It is possible to construct the apparatus such that this controlled nitrogen gas is supplied through the nitrogen supply nozzle 21 into the drying process space DS.

At this stage, a predetermined time T2 is measured and when the time T2 is elapsed (step 27), the exhaust damper 27 is closed (step 28) and at the same time the vacuum exhaust damper 28 is opened (step 29) and then the vacuum pump 29 is operated (step 30). As a result, the pressure of the drying process space DS is lowered, that in turn facilitates an evaporation process of the small liquid form droplets that still remained on the substrate surface.

It should be noted that in this drying process, the degree of vacuum in the drying process space DS is set to less than 60 (torr) for its optimal condition but when the vacuum is less than 100 (torr) then it, in a practical sense, will not cause any problems in the substrate device manufacturing procedures. As a matter of fact, so far as the oxidation phenomenon is concerned, it can avoid the oxidation a great deal though the degree of the vacuum could not reach up to 100 (torr) as compared to the drying process without depressurization. Thus up to what degree of the vacuum in the drying space is required all depends upon the desired level in preventing the oxidation. Accordingly, the degree of vacuum is not defined in this section but it rather is left for the designer's choice.

Thereafter, when a predetermined time T3 is elapsed, wherein T3 is set such that after this time elapses, substrates are expected to be dried up completely (step 31), and the rotation of the rotor 14 is halted (step 32). Then the ionizer 22 end the vacuum pump 29 are stopped (step 33 and step 34), and thereafter the exhaust damper 28 is closed (step 35). At this step, the supply of nitrogen gas through the nitrogen gas supply nozzle 21 is still continued.

After the certain time elapses, when the pressure in the drying process space DS raised to an atmospheric pressure level (step 36), the cover 13 is opened (step 37) and then the substrate support 15 is raised by the support lifting mechanism 16 to take the substrates W, that have been dried, out of the chamber 11 (step 38). In case that the substrates W should not be taken out of the chamber 11 in consideration of the later steps after opening cover (step 37), the exhaust damper 27 is kept closed to prevent the introduction of ambient air.

When the take out step of all the substrates is completed, the supply of nitrogen gas through the nitrogen gas supply nozzle 21 is halted (step 39) and the cover 13 is closed (step 40) to complete the substrate drying operation.

Thus with the aforementioned substrate drying apparatus, substrates w are being dried in the drying process space DS where there exists no oxygen, it becomes possible to effectively prevent a generation of the watermarks on the surface of the substrate. In particular, in case of the substrate W formed with trenches on the surface thereof, the water content of liquid droplet is invaded into the trenches at the beginning of the rotational operation. However, the water content left in the trenches is dried out without oxidation.

Figure 5:
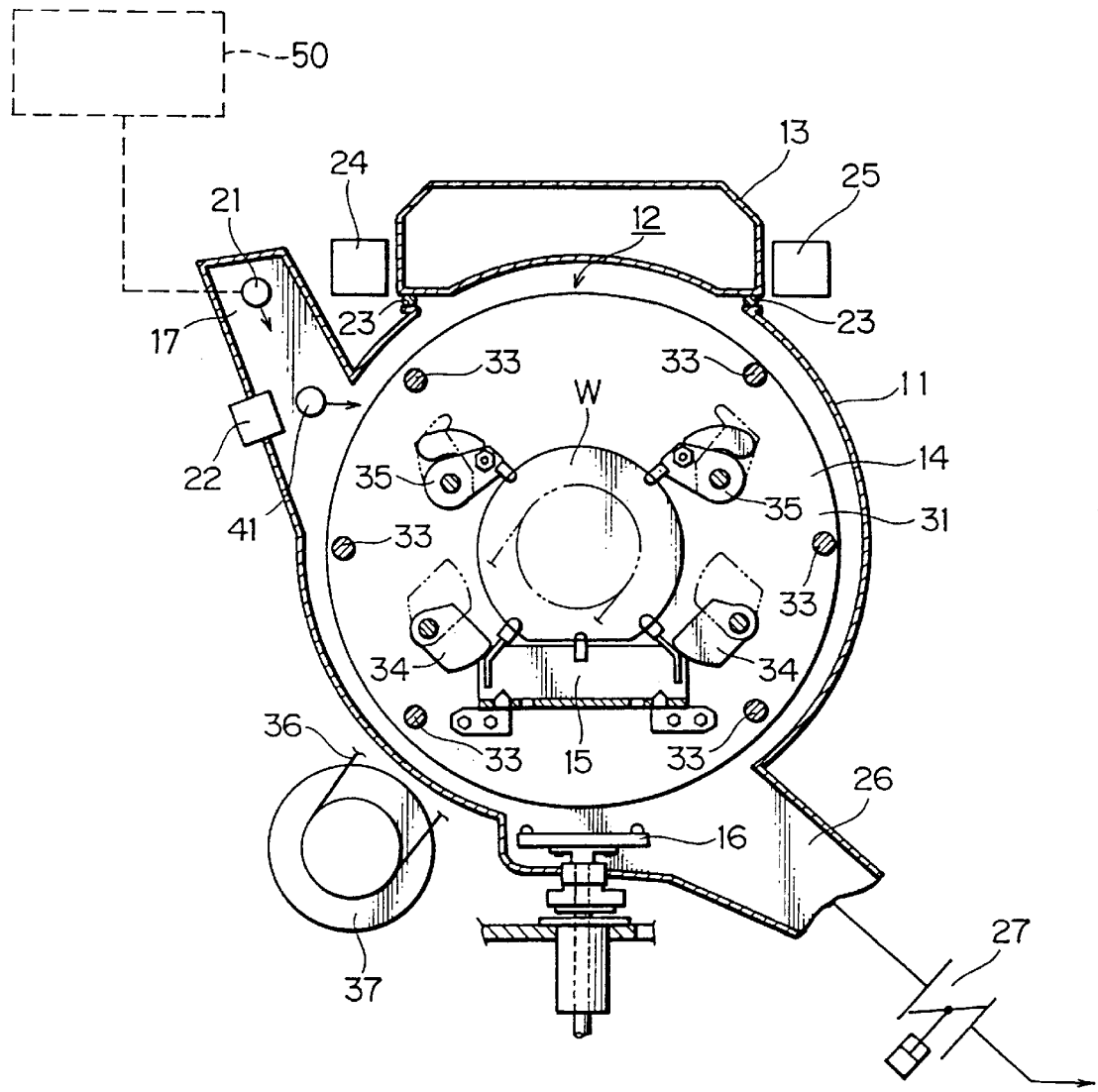
FIG. 5 is a cross sectional side view of a rotational type substrate drying apparatus of another embodiment of the present invention.

The second embodiment of this invention is hereinafter described. FIG. 5 is a cross sectional side view of the substrate drying apparatus as another embodiment of this invention. The same parts and elements in FIG. 2 that are same as in FIG. 1 are assigned with the same numerals, thus repetitive explanation for the parts and elements are omitted.

The substrate drying apparatus shown in FIG. 5 is different from the substrate drying apparatus shown in FIG. 1 in two points; one point is an installation of an IPA (isopropyl alcohol) supply nozzle 41 in the reserve space for supplying IPA as a water soluble alcohol into the chamber 11 and the second point is an omission of the vacuum exhaust damper 28 that is connected to the vacuum pump 29. The IPA supply nozzle 41 is to supply an IPA vapor as a carrier gas mixed with nitrogen gas to the drying process space DS. Where IPA vapor supplied together with nitrogen gas is generated in an unillustrated IPA evaporation tank.

Figure 6:
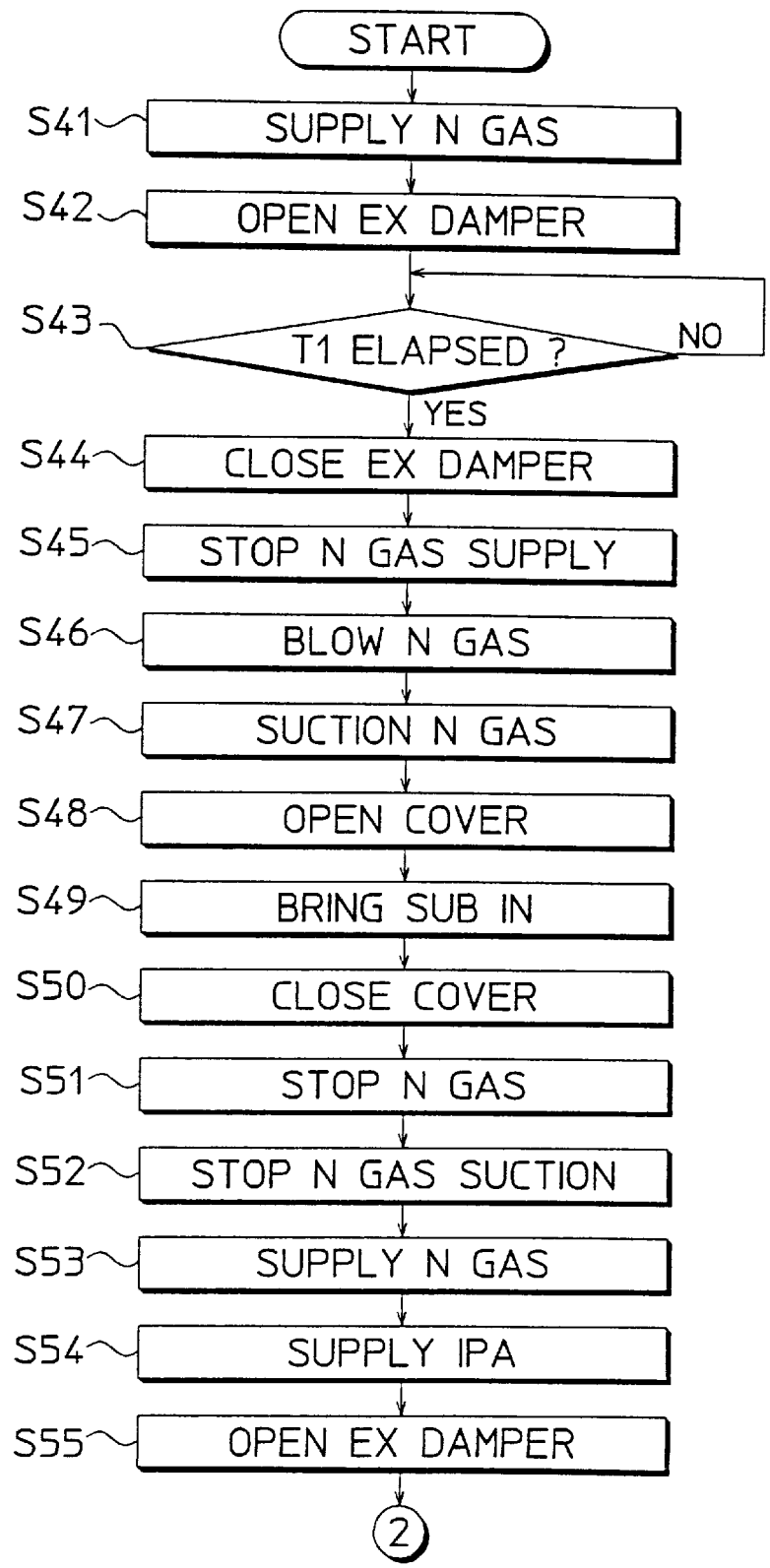
FIG. 6 is a flowchart showing a drying process of the substrate according to the second embodiment.
Figure 7:
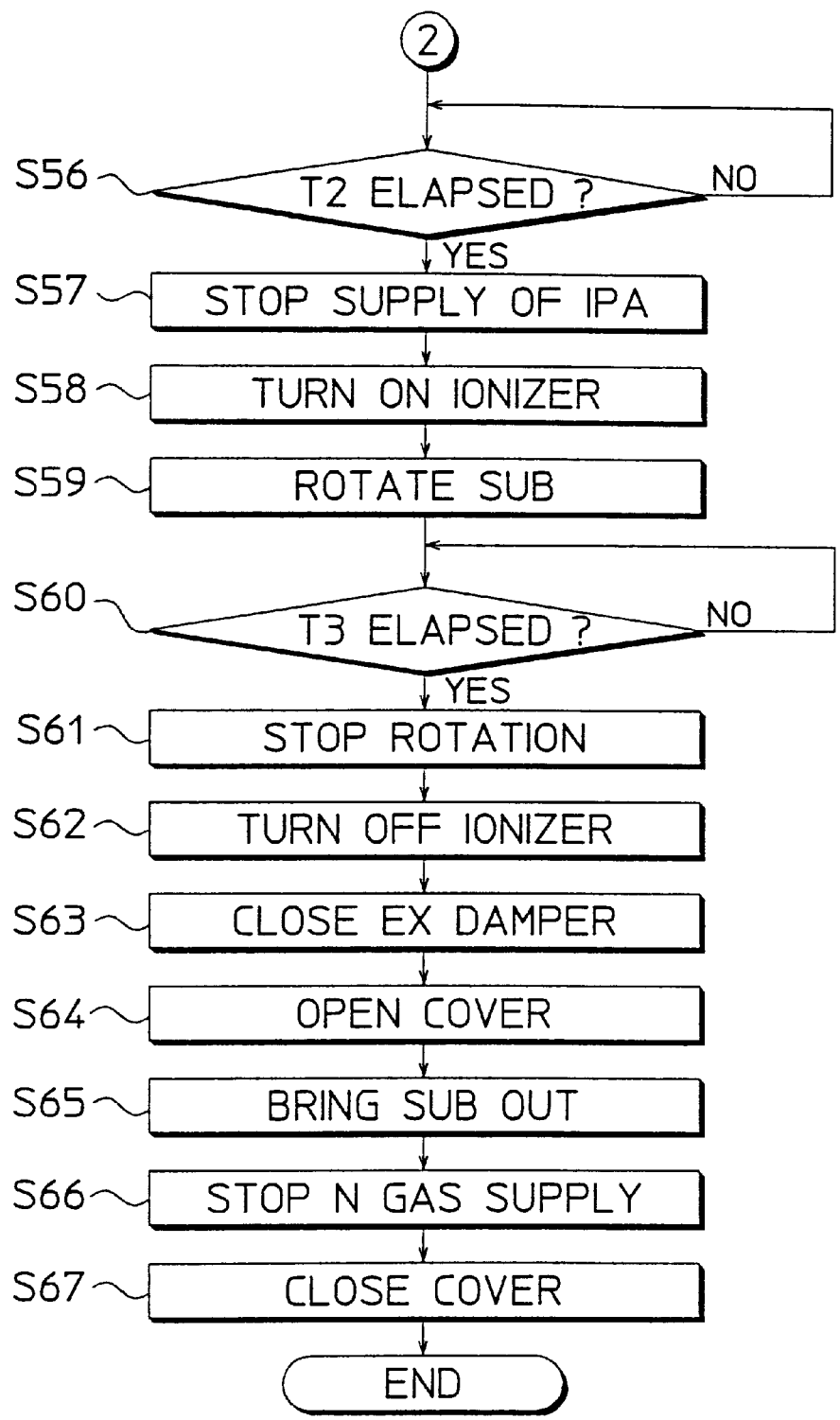
FIG. 7 is a flowchart showing a drying process of the substrate according to the second embodiment.

Next a drying operation of the substrates W with this substrate drying apparatus is described along with flowcharts shown in FIGS. 6 and 7.

Initially, it is assumed that the cover 13 and the exhaust damper 27 are closed. In this state, nitrogen gas is supplied from the nitrogen gas supply nozzle 21 into the drying process space DS (step 41) and the exhaust damper 27 is closed (step 42). Then this state is maintained until the predetermined time T1 is elapsed (step 43). When the predetermined time T1 has elapsed, gas filling the drying process space DS was purged by nitrogen gas and, as a result, the drying process space DS is filled with an inert gas.

Then the exhaust damper 27 is closed (step 44) and the supply of nitrogen gas from the nitrogen gas supply nozzle 21 is halted (step 45). Thereafter, the nitrogen gas spray nozzle 24 is set to spray the nitrogen gas (step 46) and the nitrogen gas suction nozzle 25 is set to intake nitrogen gas being sprayed (step 47).

In this state, the cover 13 is opened (step 48). At this stage, the exhaust section 26 at the chamber 11 is closed and a flow of nitrogen gas (in a form of nitrogen curtain) is formed right above the opening 12 because both nitrogen gas spray nozzle and nitrogen gas suction nozzle are activated. Because of the flow of nitrogen gas in a form of nitrogen curtain, invasion of the ambient air including oxygen through the opening 12 can be prevented thereby enabling to maintain the drying process space DS filled with the inert gas.

Then the substrate support 15 is raised in its position to receive the substrates W to be treated in this chamber 11 and the substrates are brought into the chamber 11 (step 49). At this stage, the substrates being brought into the chamber 11 are all subject to pass the curtain form flow of nitrogen gas produced by the nitrogen spray nozzle 24 and the nitrogen suction nozzle 25, thus air somehow existing around the substrates are blown away by nitrogen gas splashed from the nitrogen gas spray nozzle 24 when the substrates going through the curtain form nitrogen gas flow formed right above the opening 12. As a result, the air is prevented from being brought into the drying process space DS and the state that the drying process space DS is filled with the inert gas is maintained.

Upon completion of bringing the substrates into the chamber 11, the cover 13 is closed (step 50), then a spray of the nitrogen gas at the nitrogen gas spray nozzle 24 is halted (step 51) and at the same time the suction of the nitrogen gas suction nozzle is halted (step 52).

Then nitrogen gas is again supplied from the nitrogen gas supply nozzle 21 to the drying process space DS (step 53) and at the same time IPA vapor is supplied from the IPA supply nozzle 41 to the drying process space DS (step 54) and the exhaust damper 27 is opened (step 55). Thus supplied IPA vapor covers the an entire surface of each substrate W. In other words, IPA vapor dissolves in droplets staying over an entire surface of each substrate W that includes not only planar surfaces thereof but also the inner walls of trenches formed on the substrata. Accordingly, the surface tension of all the droplets staying over the entire surface of the substrate W is significantly lowered and the drying operation thereof is facilitated.

When a predetermined time T2 is elapsed, supply of IPA vapor from the IPA supply nozzle 41 is halted (step 57). Thereafter, the ionizer 22 is activated to ionize nitrogen gas passing the area of the ionizer 22 (step 58).

At this stage, the rotor 14 is driven to rotate the substrate W around an axis approximately coinciding with a center of the principal plane of the substrate (step 59) for removing liquid form small droplets remaining on the substrate surface by a centrifugal force generated by the rotation and this droplet removing operation is facilitated by a supply of IPA vapor from the IPA supply nozzle 41, by lowering the surface tension of the droplets. Then all the droplets and IPA vapor left the substrate surface are discharged along the flow of nitrogen through the exhaust section 26.

Accordingly, all the gas components in the drying process space DS are purged by nitrogen gas, the oxidation on the surface of the substrate W, therefore, can be avoided and thus no water mark is to be formed on the surface of the substrate W. In addition, this apparatus is so constructed that the ambient air surrounding the chamber 11 is not introduced into the drying process space DS unlike the conventional substrate drying apparatus as described in the former section; therefore, a gas (an inert gas) of a certain temperature and a certain humidity can be introduced into the drying process space DS, enabling to maintain a drying condition of the substrate in the drying process space. In addition, since IPA is dissolved in the droplets, resulting in the surface tension thereof being lowered, easing the droplets leaving the surface of the substrate especially with a centrifugal force applied to the substrate when being rotated. With the introduction of IPA vapor, it also is made possible to remove tiny droplets by the centrifugal force alone, thus drying operation is enhanced. As a result, the drying operation of the substrates W with introduction of the IPA vapor therein can be carried out in a shorter period of time than in the case without introduction of the IPA vapor.

This state is kept for a certain time period T3 (step 60) until the substrates that are in the drying process space are all dried up and then the rotation of the rotor 14 is stopped (step 61). Thereafter, the ionizer 22 is stopped (step 62) and at the same time the exhaust damper 27 is closed (step 63). At this stage, the supply of nitrogen gas from the nitrogen gas supply nozzle 21 is being continued.

Then the cover 13 is opened (step 64), and the substrate support 15 is raised by the support lifting mechanism 16 to bring the substrates W having been treated out from the chamber 11 (step 65). In addition, especially when the substrates W are not immediately taken out from the chamber 11 in convenience of the later stage, the exhaust damper 27 is opened so as to prevent an abrupt rise in pressure of the drying process space DS.

Then the nitrogen gas supply from the nitrogen gas supply nozzle 21 is halted (step 66) and the cover 13 is closed (step 67) to end the substrate drying operation.

With the aforementioned steps, all the gas components in the drying process space DS are purged by nitrogen gas thus incredibly small amount of oxygen is left in the drying process space DS. Moreover, the nitrogen gas supplied into the drying process space DS is ionized by the ionizer 22. Therefore, static electricity caused by the friction between nitrogen gas and the substrate W is eliminated, thereby preventing electric-discharge by the static electricity. Accordingly, though the IPA gas as an inflammable gas by its nature is used in the second embodiment, a phenomenon of inflammability by this gas is prevented.

In the following section, a third embodiment of this invention is described. A rotation type substrate drying apparatus as a third embodiment has a similar structure as the one shown in FIG. 5. The third embodiment, however, is only different from the second embodiment shown in FIG.

Figure 8:
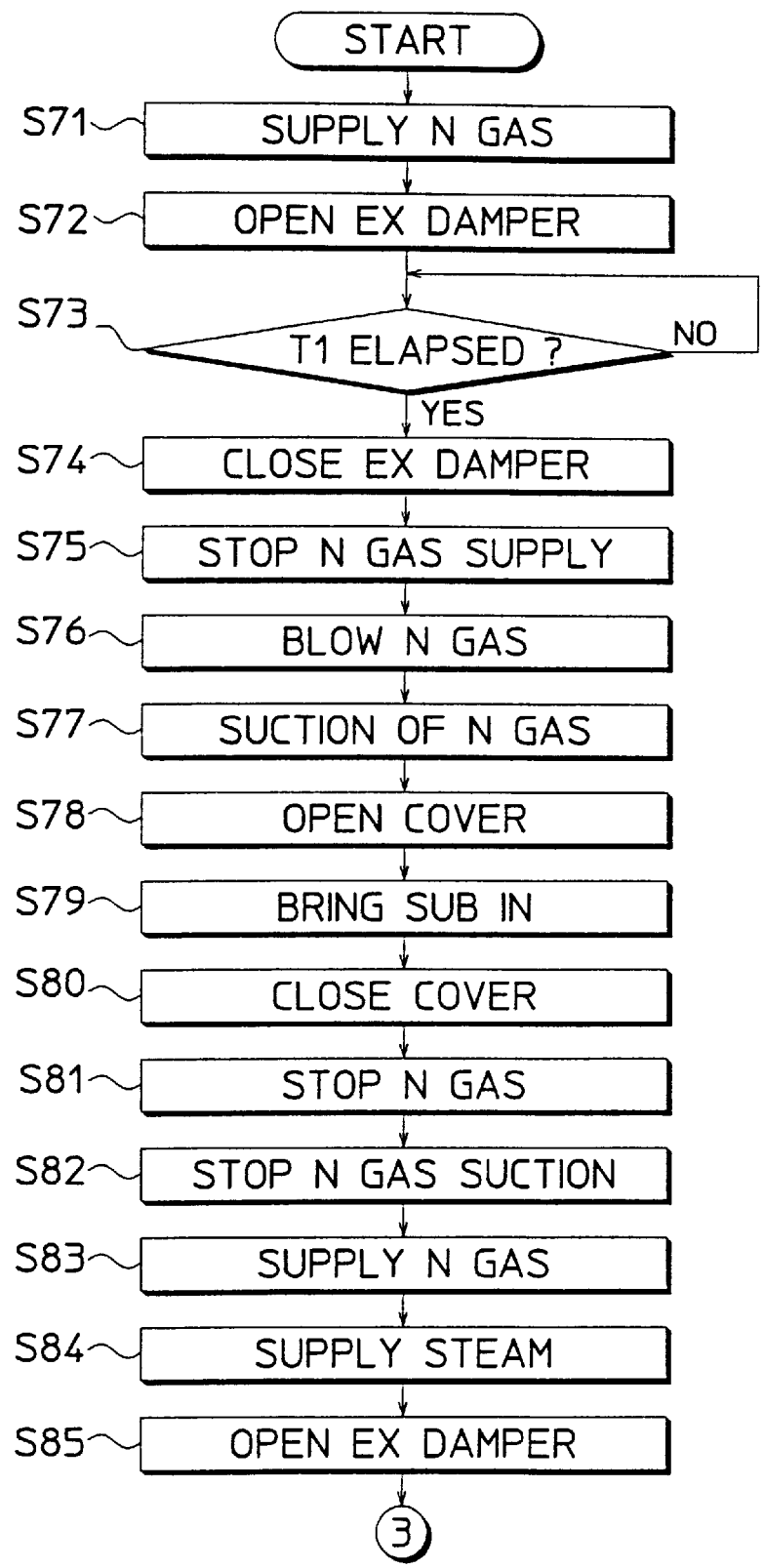
FIG. 8 is a flowchart showing a drying process of the substrate according to a third embodiment.

5 in that the IPA supply nozzle 41 of the second embodiment is replaced with a steam supply nozzle 41' for supplying heated steam. Thus detailed drawing for the third embodiment is omitted. The steam supply nozzle 41' is to supply steam as a heating gas generated in an unillustrated heated steam generating tank together with nitrogen gas into the drying process space DS. FIGS. 8 and 9 are flowcharts showing substrate drying procedures with use of the third embodiment type apparatus.

In the drying process of the substrate drying apparatus in its third embodiment, an IPA vapor supply step of the second embodiment substrate drying apparatus is replaced with a steam supply step (step 84). With this steam supply step, the liquid droplets adhering to the substrate surface are evaporated with the heated steam, thus the drying process of the liquid form droplets on the substrate W being rotated is facilitated.

At this step, as in the first embodiment, the contents of gas filling in the drying process space DS are purged by nitrogen gas. Therefore, oxidation on the substrate surface is prevented and thus preventing the formation of the water marks on the substrate W.

In the foregoing embodiments, in order to facilitate the drying process of the substrate W, the step of reducing the pressure of the drying process space DS and the step of supplying IPA gas or heated steam into the drying process space DS are respectively employed; a combination of these steps into one embodiment is also permitted to further facilitate the drying process.

In the foregoing embodiments, the substrate is rotated around a horizontally extended axis, i.e., around an axis perpendicular to the principal surface of the substrate W. However, this invention does not limit its application thereto. Rather it is possible to apply this invention to an apparatus having a vertical rotational axis end something other than these rotational axes.

Moreover, in the foregoing embodiments, the structure such that the plural substrates W are directly supported by the substrate support 15 and are rotated is employed as the substrate drying apparatus of this invention. However, the application of this invention is not limited only thereto but is also applicable to the rotational type substrate drying apparatus having a structure such that the plural substrates are to be placed in a cassette and then the cassette is to be rotated and is also applicable to the rotation type substrate drying apparatus having a structure such that a single substrate W is held in the chamber by such as a spin-chuck.

Furthermore, in the foregoing embodiments, nitrogen gas is employed as an inert gas. However, use of other inert 9 as is possible.

Yet furthermore, in the foregoing embodiments, the substrate drying apparatus for drying a semiconductor wafer W is taken as an illustration of the application of this invention. However, the application of this invention is no way limited thereto but is possible to those other apparatuses for use in drying glass substrate for a liquid crystal panel and a mask substrate for manufacturing a semiconductor.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A substrate drying apparatus in which a substrate is dried by removing droplets adhering to the substrate, the substrate drying apparatus comprises:

a chamber with an opening through which the substrate enters and exits the chamber;

a cover sealing the opening;

inert gas supply means for supplying an inert gas into a sealed drying process space formed by the chamber and the cover;

an exhaust section exhausting the supplied inert gas out of the sealed drying process space; and inert gas blowing means provided in a vicinity of the opening and adapted for blowing an inert gas against a substrate being brought into the chamber through the opening.

2. The substrate drying apparatus according to claim 1, further comprising depressurization means for reducing pressure in the drying process space.

3. The substrate drying apparatus according to claim 1, further comprising vapor supply means for supplying vapor of a water soluble alcohol into the drying process space.

4. A substrate drying apparatus in which a substrate is dried by removing droplets adhering to the substrate, the substrate drying apparatus comprises:

a chamber with an opening through which the substrate enters and exits the chamber;

a cover sealing the opening;

inert gas supply means for supplying an inert gas into a sealed drying process space formed by the chamber and the cover;

an exhaust section exhausting the supplied inert gas out of the sealed drying process space; and steam supply means for supplying heating steam into the drying process space.

5. A substrate drying apparatus in which a substrate is dried by removing droplets adhering to the substrate, the substrate drying apparatus comprises:

a chamber with an opening through which the substrate enters and exits the chamber;

a cover sealing the opening;

inert gas supply means for supplying an inert gas into a sealed drying process space formed by the chamber and the cover;

an exhaust section exhausting the supplied inert gas out of the sealed drying process space;

depressurization means for reducing pressure in the drying process space; and rotation means for removing liquid droplets adhering to the substrate by rotating the substrate.

6. A substrate drying apparatus in which a substrate is dried by removing droplets adhering to the substrate, the substrate drying apparatus comprises:

a chamber with an opening through which the substrate enters and exits the chamber;

a cover changeable between an open state and a close state with respect to the opening, and the cover and chamber defining a drying process space when the cover is in the close state;

inert gas supply means for supplying an inert gas into the drying process space defined by the chamber and the cover to fill the drying process space with the inert gas; and rotation means for removing the liquid droplets adhering to the substrate by rotating the substrate.

7. The substrate drying apparatus according to claim 6, further comprising an ionizer for ionizing an inert gas supplied by the inert gas supply means.

8. The substrate drying apparatus according to claim 7, further comprising a reserve space in communication with the chamber, and the inert gas supply means and the ionizer are in the reserve space.

9. A method for drying a substrate in a drying space which is defined by a chamber, having an opening and an exhaust section, and a cover for opening and closing the opening, the method comprising the steps in the order of:

a) a step of purging gas in a sealed drying process space, defined by the chamber and the cover, through the exhaust section by supplying an inert gas;

b) a step of forming an inert gas curtain for closing the opening of the chamber;

c) a step of bringing the substrate into the chamber by opening the cover and thereafter bringing the substrate into the chamber through the opening;

d) a step of closing the opening with the cover; and e) a step of drying the substance, said drying step including a sub step of rotating the substrate thereby drying the substrate.

10. A method for drying a substrate in a drying space which is defined by a chamber, having an opening and an exhaust section, and a cover for opening and closing the opening, the method comprising the steps in the order of:

a) a step of purging gas in a sealed drying process space, defined by the chamber and the cover, through the exhaust section by supplying an inert gas;

b) a step of forming an inert gas curtain for closing the opening of the chamber;

c) a step of bringing the substrate into the chamber by opening the cover and thereafter bringing the substrate into the chamber through the opening;

d) a step of closing the opening with the cover; and e) a step of drying the substance, said drying step including a sub step of rotating the substrate while an inert gas is being supplied to the drying process space.

11. The method according to claim 10, wherein the step of drying further includes a sub step of ionizing a part of the inert gas supplied to the drying process space.

12. The method according to claim 10, further comprising a step of closing the exhaust section subsequent to the step of purging and prior to the step of bringing the substrate into the chamber.

* * * * *